United States Patent
Miao et al.

(10) Patent No.: US 9,660,673 B2
(45) Date of Patent: May 23, 2017

(54) APPARATUS AND METHOD FOR CANCELING INTER-MODULATION PRODUCTS

(71) Applicant: Telefonaktiebolaget L M Ericsson (publ), Stockholm (SE)

(72) Inventors: Qingyu Miao, Beijing (CN); Youping Su, Taby (SE); Huaisong Zhu, Beijing (CN)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 0 days.

(21) Appl. No.: 14/898,838

(22) PCT Filed: Jun. 26, 2013

(86) PCT No.: PCT/CN2013/077960
§ 371 (c)(1),
(2) Date: Dec. 16, 2015

(87) PCT Pub. No.: WO2014/205659
PCT Pub. Date: Dec. 31, 2014

(65) Prior Publication Data
US 2016/0134310 A1 May 12, 2016

(51) Int. Cl.
*H04L 27/36* (2006.01)
*H04B 1/04* (2006.01)
(Continued)

(52) U.S. Cl.
CPC ............ *H04B 1/0475* (2013.01); *H04B 1/40* (2013.01); *H04L 25/03343* (2013.01);
(Continued)

(58) Field of Classification Search
CPC ............ H04L 27/368; H04L 25/03343; H04L 25/03821; H04B 1/40; H04B 1/0475; H04B 15/00; H03D 2200/0088
(Continued)

(56) References Cited

U.S. PATENT DOCUMENTS 8,055,235 B1   11/2011  Gupta et al.
9,270,231 B2*   2/2016  Utsunomiya ......... H03F 1/3247
(Continued)

FOREIGN PATENT DOCUMENTS

CA      2658070 A1    9/2009
CN    101304395 A    11/2008
(Continued)

OTHER PUBLICATIONS

PCT International Search Report, mailed Mar. 27, 2014, in connection with International Application No. PCT/CN2013/077960, all pages.
(Continued)

*Primary Examiner* — Jean B Corrielus
(74) *Attorney, Agent, or Firm* — Patent Portfolio Builders, PLLC

(57) ABSTRACT

The present disclosure provides an apparatus and a method for canceling inter-modulation (IM) products in a transceiver. The apparatus includes: a pre-distortion circuit configured to estimate a first IM product caused by a transmission signal and pre-distort the transmission signal to cancel the first IM product; an IM product calculator configured to calculate a second IM product caused by the transmission signal in a received signal based on the first IM product; and a subtractor configured to subtract the second IM product from the received signal.

4 Claims, 4 Drawing Sheets

(51) Int. Cl.
*H04L 25/03* (2006.01)
*H04B 1/40* (2015.01)

(52) U.S. Cl.
CPC ...... *H04L 25/03821* (2013.01); *H04L 27/368* (2013.01); *H03D 2200/0088* (2013.01)

(58) Field of Classification Search
IPC .................................................... H04L 27/368
See application file for complete search history.

(56) References Cited

U.S. PATENT DOCUMENTS

| | | | |
|---|---|---|---|
| 2007/0217488 A1* | 9/2007 | Smaini | H04B 1/525 375/219 |
| 2008/0187035 A1* | 8/2008 | Nakamura | H03F 1/0288 375/232 |
| 2009/0068974 A1 | 3/2009 | Smith | |
| 2011/0075754 A1 | 3/2011 | Smith | |
| 2011/0149714 A1 | 6/2011 | Rimini et al. | |
| 2014/0334349 A1* | 11/2014 | Mao | H04B 1/0475 370/278 |
| 2014/0362949 A1* | 12/2014 | Pratt | H04B 1/0475 375/296 |
| 2015/0236731 A1* | 8/2015 | Ghannouchi | H04B 1/0475 375/296 |

FOREIGN PATENT DOCUMENTS

| | | |
|---|---|---|
| CN | 102457458 A | 5/2012 |
| KR | 100798399 B1 | 1/2008 |

OTHER PUBLICATIONS

PCT Written Opinion, mailed Mar. 27, 2014, in connection with International Application No. PCT/CN2013/077960, all pages.

* cited by examiner

APPARATUS AND METHOD FOR CANCELING INTER-MODULATION PRODUCTS

TECHNICAL FIELD

The present disclosure relates to wireless communication technology, and more particularly, to an apparatus and a method for canceling Inter-Modulation (IM) products.

BACKGROUND

Currently, with rapid development of global mobile communications, telecommunication operators are continuously interested in reducing total cost of ownership (TCO) and looking for cost-effective methods for expanding mobile networks. This is necessary for coping with the rapidly growing demands of users. In order to reduce the TCO, a base station can adopt a multi-carrier technique, e.g., a base station can use a number of carriers, or carrier frequencies, within its transceiver. Such base station can be referred to as a multi-carrier base station. A multi-carrier base station can have multiple carriers in one or more transmission frequency bands for one or more radio access technologies (RATs). A multi-carrier base station needs to support higher output power and broader bandwidth than legacy base stations to provide improved coverage and capacity.

Typically, a transceiver includes non-linear components, which means that the output of each of these components is a non-linear function of its input. Given a multi-carrier signal to be transmitted (hereinafter referred to as "transmission signal"), a non-linear component will produce, at its output, additional spectral components at frequencies different from the carrier frequencies of the transmission signal. These spectral components are known as inter-modulation (IM) products and have a specific relation in frequency with a transmission signal to be transmitted by the transceiver. The IM products include active IM (AIM) products and passive IM (PIM) products.

In order to cancel the IM product caused by the transmission signal from the signal actually transmitted by a transceiver, an analog or digital pre-distortion technique has been proposed. FIG. 1 shows a structure of a transceiver 100 provided with a digital pre-distortion (DPD) circuit 110. The DPD circuit 110 has a coupler 111 for obtaining a copy of a radio frequency (RF) signal output from a power amplifier (PA) 121 and feed it back to a demodulation and down-conversion circuit 112. The copy of the RF signal contains the transmission signal and an IM product which is caused by the transmission signal and produced in a transmission signal path 120 (including e.g., a Digital-to-Analog Converter (DAC) 123, a modulation and up-conversion circuit 122 and the PA 121). The demodulation and down-conversion circuit 112 down-converts the copy of the RF signal into an intermediate frequency (IF) signal. The DPD circuit 110 also includes an Analog-to-Digital Converter (ADC) 113 for converting the IF signal into a digital signal which is then processed by a Digital Signal Processor (DSP) 114. The transmission signal is delayed at a delay circuit 115 and the delayed signal is input to the DSP 114 which then estimates the IM product. Finally, the transmission signal is gain adjusted at a gain adjustment circuit 116 according to the estimated IM product from the DSP 114. In this way, the transmission signal is pre-distorted to cancel the IM product. The transceiver 100 also has an antenna front end 130 including a transmission filter 131, a reception filter 132 and an antenna 133. Here, the band pass transmission filter 131 is provided for filtering the IM product before the transmission signal is fed to the antenna 133. The respective functions of the PA 121, the modulation and up-conversion circuit 122, the DAC 123, the transmission filter 131, the reception filter 132 and the antenna 133 are well known and thus the details thereof will be omitted here. FIG. 2 is a schematic diagram of signal spectra with and without DPD. It can be seen from FIG. 2 that, with DPD, the IM product is significantly reduced. After being filtered by the transmission filter, the IM product is much lower than the transmission signal (Carrier 1 (C1) and Carrier 2 (C2) as shown in FIG. 2).

Since the IM products are extended over the frequency spectrum out of the transmission frequency bands, there is a risk that some of the IM products will end up in the reception frequency band of the transceiver, thereby causing distortion in a signal received at the transceiver. Since a multi-carrier base station transceiver supports a high transmit power and has a number of carriers arranged over a broad bandwidth, the IM products may cause a considerable distortion in a received signal. For example, it can also be seen from FIG. 2 that a residual IM product falls into the reception frequency band of the transceiver.

Furthermore, there are further IM products that cannot be canceled by the DPD or filtered by the transmission filter. For example, these IM products are produced at an antenna, a connector connected to the antenna, a connector connected to the transmission filter, a feeder cable connecting the connectors, and the transmission filter itself, as shown in FIG. 3. Although these IM products are much lower than the IM products caused by e.g. the power amplifier, they may cause distortion to a received signal when the IM products fall into the reception frequency band of the transceiver, especially if the received signal is weak. FIG. 4 shows an example of signal spectra in which an IM product falling into the reception frequency band is comparable to the received signal.

Patent document U.S. Pat. No. 8,055,235B1 describes a method for interference cancellation in which a cancellation signal and an interference signal is summed in analog domain. However, this method is only applicable to cancel large interference signals, but is not applicable to cancel IM products at very low level, especially PIM products produced at the passive components shown in FIG. 3. Patent documents US2011/0149714 and US20090068974 describe similar interference cancellation techniques that cancel interferences in digital domain. But again, they are not applicable to cancel IM products at very low level, especially PIM products. Patent document CA2658070 describes a method for blindly detecting PIM products. However, it fails to provide any solution for canceling them. Patent document US2011/0075754A1 describes a method for removing PIM products generated in a wave guide and an antenna that fall into a reception frequency band. However, it cannot detect or cancel IM products produced at the components shown in FIG. 3 and cannot detect or cancel IM products at very low level, such as −100 dBm.

There is thus a need for an improved solution for canceling IM products caused by a transmission signal from a received signal.

SUMMARY

It is an object of the present disclosure to overcome at least some of the above problems in the prior art.

According to a first aspect of the present disclosure, an apparatus for canceling inter-modulation (IM) products in a transceiver is provided. The apparatus includes: a pre-distortion circuit configured to estimate a first IM product caused by a transmission signal and pre-distort the transmission signal to cancel the first IM product; an IM product calculator configured to calculate a second IM product caused by the transmission signal in a received signal based on the first IM product; and a subtractor configured to subtract the second IM product from the received signal.

In an embodiment, the transceiver includes a transmission signal path, a reception signal path and an antenna front end. The first IM product is produced in the transmission signal path and the second IM product is produced in the antenna front end and the reception signal path.

In an embodiment, the pre-distortion circuit is configured to estimate, during a training period, a reference IM product caused by a reference transmission signal. The IM product calculator includes: a coefficient estimation unit configured to estimate, during the training period, a coefficient characterizing an equivalent transfer function of the antenna front end and the reception signal path based on the reference IM product and a received signal containing an IM product caused by the reference transmission signal; and an IM product calculation unit configured to calculate the second IM product based on the first IM product and the coefficient.

In an embodiment, the coefficient estimation unit is configured to estimate the coefficient by using a pilot-based estimation algorithm in which the reference IM product is used as a pilot.

According to another embodiment of the present disclosure, a method for canceling inter-modulation (IM) products in a transceiver is provided. The method includes: estimating a first IM product caused by a transmission signal and pre-distorting the transmission signal to cancel the first IM product; calculating a second IM product caused by the transmission signal in a received signal based on the first IM product; and subtracting the second IM product from the received signal.

In an embodiment, the transceiver includes a transmission signal path, a reception signal path and an antenna front end. The first IM product is produced in the transmission signal path and the second IM product is produced in the antenna front end and the reception signal path.

In an embodiment, the method further includes: estimating, during a training period, a reference IM product caused by a reference transmission signal, and estimating, during the training period, a coefficient characterizing an equivalent transfer function of the antenna front end and the reception signal path based on the reference IM product and a received signal containing an IM product caused by the reference transmission signal. The second IM product is calculated based on the first IM product and the coefficient.

In an embodiment, the coefficient is estimated by using a pilot-based estimation algorithm in which the reference IM product is used as a pilot.

With the embodiments of the present disclosure, the IM product estimated by the pre-distortion circuit is reused to calculate the IM product caused by the transmission signal in the received signal and finally cancel the calculated IM product from the received signal. In this way, the IM product caused by the transmission signal, including AIM components and PIM components, can be removed from the received signal.

BRIEF DESCRIPTION OF THE DRAWINGS

The above and other objects, features and advantages will be more apparent from the following description of embodiments with reference to the figures, in which.

DETAILED DESCRIPTION

The embodiments of the present disclosure will be detailed below with reference to the drawings. It should be noted that the following embodiments are illustrative only, rather than limiting the scope of the present disclosure.

Figure 1:
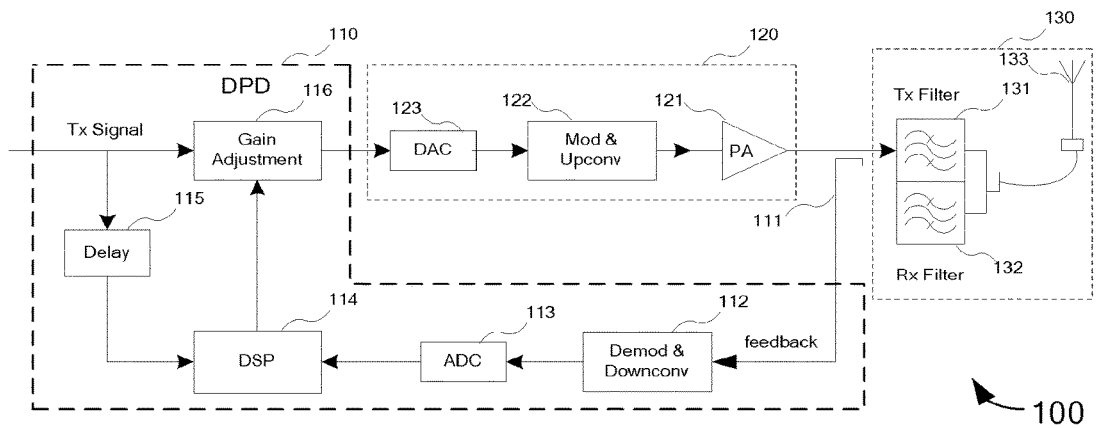
FIG. 1 shows a structure of a transceiver provided with a DPD circuit according to the prior art.
Figure 2:
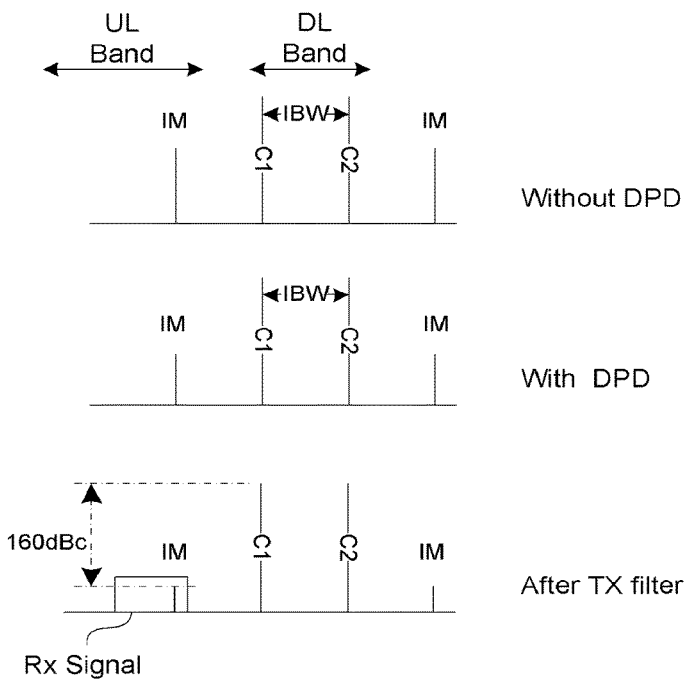
FIG. 2 is a schematic diagram of signal spectra with and without DPD.
Figure 3:
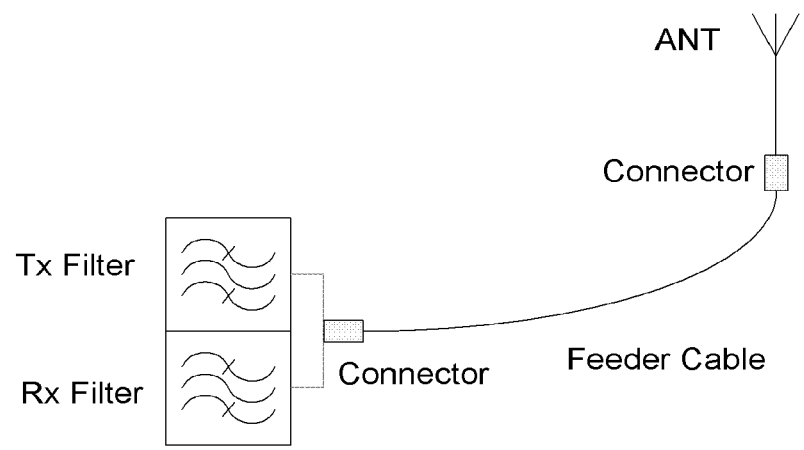
FIG. 3 shows a structure of an antenna front end.
Figure 4:
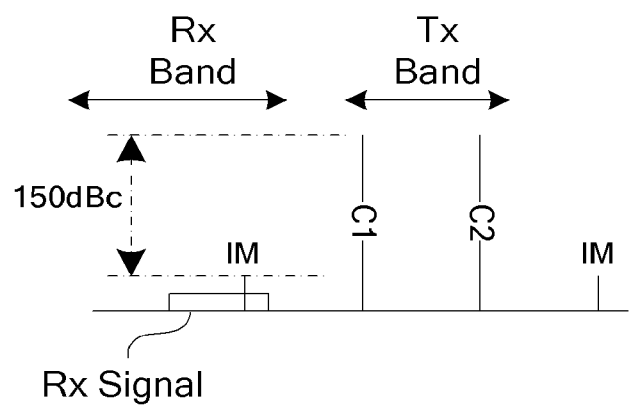
FIG. 4 is a schematic diagram of signal spectra illustrating a PIM product falling into reception frequency band.
Figure 5:
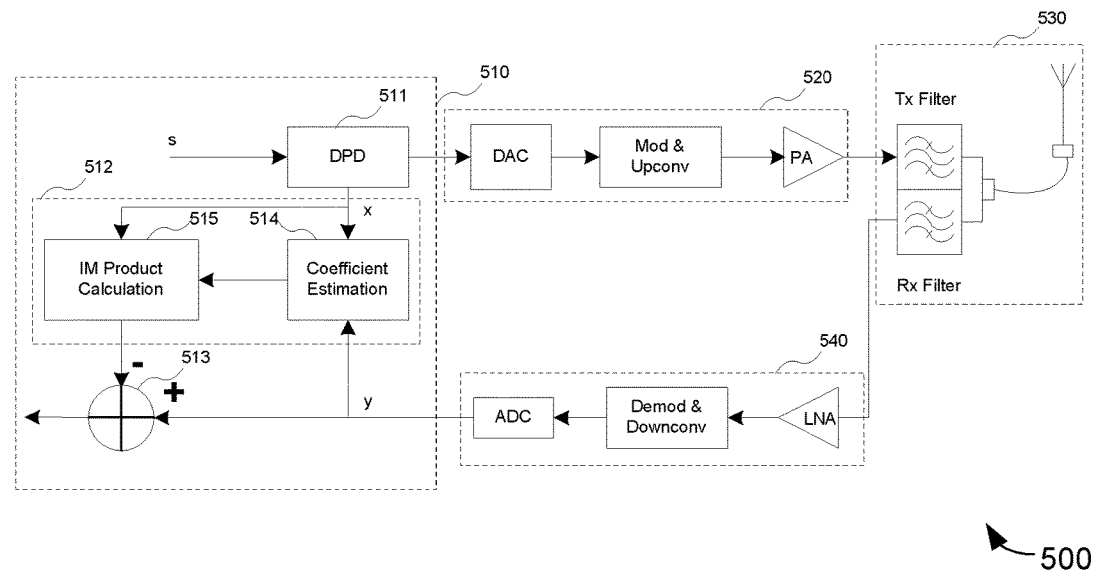
FIG. 5 shows a structure of a transceiver including an apparatus for canceling IM products according to an embodiment of the present disclosure.

FIG. 5 shows a structure of a transceiver 500 including an apparatus 510 for canceling IM products according to an embodiment of the present disclosure. The transceiver 500 can be used in a base station. As shown in FIG. 5, the transceiver 500 further includes a transmission signal path 520, an antenna front end 530 and a reception signal path 540. The transmission signal path 520 includes e.g., a Digital-to-Analog Converter (DAC), a modulation and up-conversion circuit and a Power Amplifier (PA). The antenna front end 530 includes e.g., an antenna, a connector connected to the antenna, a connector connected to the transmission filter, a feeder cable connecting the connectors, a transmission filter and a reception filter. The reception signal path 540 includes e.g., a Low Noise Amplifier (LNA), a demodulation and down-conversion circuit and an Analog-to-Digital Converter (ADC). All of the components included in the transmission signal path 520, the antenna front end 530 and the reception signal path 540 are well known in the art and the details thereof will be omitted here.

The apparatus 510 includes a pre-distortion (DPD) circuit 511, an IM product calculator 512 and a subtractor 513.

The pre-distortion circuit 511 estimates an IM product (hereinafter denoted as IM1) caused by a transmission signal and pre-distorts the transmission signal to cancel IM1. Here, IM1 includes IM components produced in the transmission signal path 520, e.g., the $3^{rd}$ order and/or the $5^{th}$ order IM products. The pre-distortion circuit 511 can estimate IM1 using any known DPD technique.

The IM product calculator 512 calculates an IM product (hereinafter denoted as IM2) caused by the transmission signal in a received signal based on IM1. Here, IM2 includes IM components produced in the antenna front end 530 and the reception signal path 540. The IM product calculator 512 includes a coefficient estimation unit 514 and an IM product calculation unit 515, which will be detailed below.

During a training period, the pre-distortion circuit 511 estimates a reference IM product (hereinafter denoted as x) caused by a reference transmission signal. The coefficient estimation unit 514 estimates a coefficient characterizing an equivalent transfer function (hereinafter denoted as h) of the antenna front end 530 and the reception signal path 540 based on x and a received signal (hereinafter denoted as y) containing an IM product (hereinafter denoted as im) caused by the reference transmission signal.

In particular, the IM product im contains IM components produced in the antenna front end 530 and the reception signal path 540 and possibly a residual IM component leaked from the transmission filter. All these components are caused by the same reference transmission signal. That is, the IM product im and the reference IM product x are caused by the same reference transmission signal and thus have the same characteristics in frequency domain. Therefore, it is possible to calculate im from x:

$$im = h \cdot x.$$

where h is an equivalent transfer function of the antenna front end 530 and the reception signal path 540, as described above.

Therefore, the received signal y can be expressed as:

$$y = im + r = h \cdot x + r.$$

where r denotes the combination of a wanted signal and a noise but does not include any IM products.

Since both the wanted signal and the noise can be considered as white noises, the coefficient estimation unit 514 can use x as a pilot to estimate h by using any pilot-based channel estimation algorithm (such as Minimum Mean Square Error (MMSE), Least Square (LS), etc.) during the training period.

Since the estimated h can be considered to be quite stable. After the training period, the IM product calculation unit 515 can calculate IM2 based on IM1 and the estimated h:

$$IM2 = h \cdot IM1.$$

Then, the subtractor 513 subtracts IM2 from the received signal. In this way, the IM product caused by the transmission signal in the received signal can be canceled.

Figure 6:
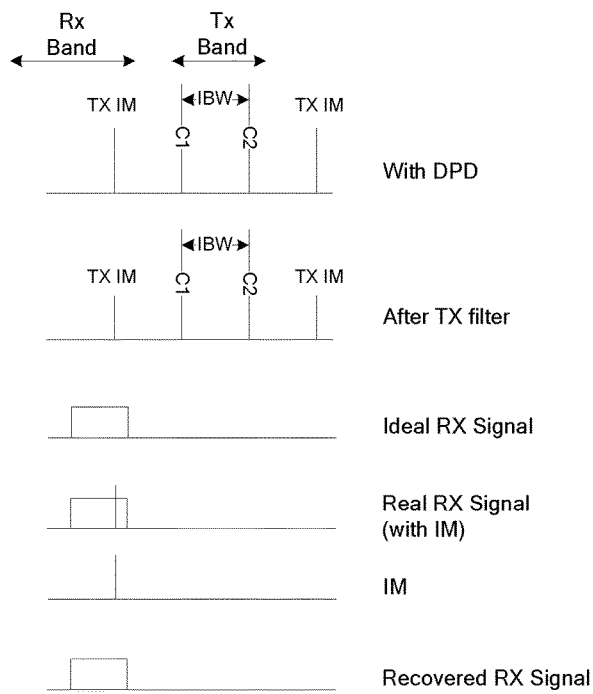
FIG. 6 is a schematic diagram of signal spectra illustrating the process of canceling IM products from a received signal.

FIG. 6 is a schematic diagram of signal spectra illustrating the process of canceling IM products from a received signal. It can be seen from FIG. 6 that the IM product, including possibly any residual IM components after DPD and filtering at the transmission filter, can be canceled from the received signal.

Figure 7:
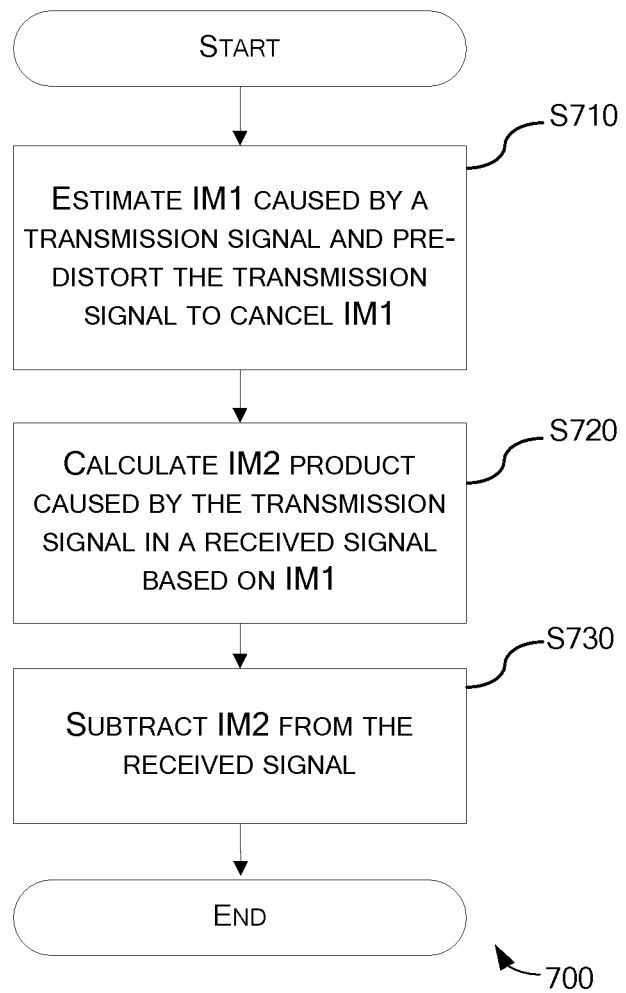
FIG. 7 is a flowchart illustrating a method for canceling IM products according to an embodiment of the present disclosure.

FIG. 7 is a flowchart illustrating a method 700 for canceling IM products according to an embodiment of the present disclosure. The method 700 can be performed at the transceiver 500. The method 700 includes the following steps.

At step S710, an IM product (IM1) caused by a transmission signal is estimated and the transmission signal is pre-distorted to cancel IM1.

At step S720, an IM product (IM2) caused by the transmission signal in a received signal is calculated based on IM1.

At step S730, IM2 is subtracted from the received signal.

In an embodiment, the method 700 further includes a step of estimating, during a training period, a reference IM product (x) caused by a reference transmission signal, and estimating, during the training period, a coefficient characterizing an equivalent transfer function (h) of the antenna front end and the reception signal path based on x and a received signal (y) containing an IM product (im) caused by the reference transmission signal. IM2 is calculated based on IM1 and h.

It is to be noted that the contents described above in relation to the transceiver 500 of FIG. 5 also apply to the method 700 according to the present disclosure.

With the embodiments of the present disclosure, the IM product estimated by the pre-distortion circuit is reused to calculate the IM product caused by the transmission signal in the received signal and finally cancel the calculated IM product from the received signal. In this way, the IM product caused by the transmission signal, including AIM components and PIM components, can be removed from the received signal.

The present disclosure has been described above with reference to the preferred embodiments thereof. It should be understood that various modifications, alternations and additions can be made by those skilled in the art without departing from the spirits and scope of the present disclosure. Therefore, the scope of the present disclosure is not limited to the above particular embodiments but only defined by the claims as attached.

The invention claimed is:

1. An apparatus for canceling inter-modulation (IM) products in a transceiver, comprising:
  a pre-distortion circuit configured to estimate a first IM product caused by a transmission signal and pre-distort the transmission signal to cancel the first IM product, wherein the first IM product is produced in a transmission signal path;
  an IM product calculator configured to calculate a second IM product caused by the transmission signal in a first received signal based on the first IM product, wherein the second IM product is produced in an antenna front end and a reception signal path; and
  a subtractor configured to subtract the second IM product from the first received signal,
  wherein the pre-distortion circuit is configured to estimate, during a training period, a reference IM product caused by a reference transmission signal, and
  the IM product calculator is further configured to:
    estimate, during the training period, a coefficient characterizing an equivalent transfer function of the antenna front end and the reception signal path based on the reference IM product and a second received signal containing an IM product caused by the reference transmission signal; and
    calculate the second IM product based on the first IM product and the coefficient.

2. The apparatus of claim 1, wherein the IM product calculator is configured to estimate the coefficient by using a pilot-based estimation algorithm in which the reference IM product is used as a pilot.

3. A method for canceling inter-modulation (IM) products in a transceiver, comprising:
  estimating a first IM product caused by a transmission signal and pre-distorting the transmission signal to cancel the first IM product, wherein the first IM product is produced in a transmission signal path;
  calculating a second IM product caused by the transmission signal in a first received signal based on the first IM product, wherein the second IM product is produced in an antenna front end and a reception signal path;
  subtracting the second IM product from the first received signal;
  estimating, during a training period, a reference IM product caused by a reference transmission signal, and
  estimating, during the training period, a coefficient characterizing an equivalent transfer function of the antenna front end and the reception signal path based on the reference IM product and a second received signal containing an IM product caused by the reference transmission signal,
  wherein the second IM product is calculated based on the first IM product and the coefficient.

4. The method of claim 3, wherein the coefficient is estimated by using a pilot-based estimation algorithm in which the reference IM product is used as a pilot.

* * * * *